United States Patent [19]
Kariyazono et al.

[11] Patent Number: 5,719,432
[45] Date of Patent: Feb. 17, 1998

[54] SEMICONDUCTOR DEVICE INCLUDING BIPOLAR TRANSISTOR WITH IMPROVED CURRENT CONCENTRATION CHARACTERISTICS

[75] Inventors: Hiroshi Kariyazono, Tokyo; Katsu Honna, Kawasaki, both of Japan

[73] Assignee: Kabushiki Kaisha Toshiba, Kawasaki, Japan

[21] Appl. No.: 670,105

[22] Filed: Jun. 25, 1996

Related U.S. Application Data

[63] Continuation of Ser. No. 286,960, Aug. 8, 1994, abandoned.

[30] Foreign Application Priority Data

Aug. 13, 1993 [JP] Japan ..................... 5-220520

[51] Int. Cl.[6] ............................................. H01L 29/732
[52] U.S. Cl. ........................... 257/565; 257/592; 257/593
[58] Field of Search ............................ 257/583, 592, 257/565, 593

[56] References Cited

FOREIGN PATENT DOCUMENTS

0268169  10/1989  Japan ........................................ 257/593

*Primary Examiner*—Wael Fahmy
*Assistant Examiner*—David B. Hardy
*Attorney, Agent, or Firm*—Finnegan, Henderson, Farabow, Garrett & Dunner, L.L.P.

[57] ABSTRACT

An N-type buried region formed in the surface area of a semiconductor substrate is electrically connected to an N-type collector region formed in an epitaxial silicon layer on the semiconductor substrate. A P-type buried region is formed to overlap part of the N-type buried region. The P-type buried region is thick in the upward and downward directions of the N-type buried region. One end portion of the P-type buried region is electrically connected to a P-type base region and the other end portion thereof is electrically connected to a base region formed in the surface area of the semiconductor layer. The base region is applied with a base potential from the base region via the buried region. An N-type emitter region is formed in the base region. The N-type buried region and the P-type buried region are simultaneously formed by use of a difference between the diffusion coefficients of impurity.

11 Claims, 7 Drawing Sheets

SEMICONDUCTOR DEVICE INCLUDING BIPOLAR TRANSISTOR WITH IMPROVED CURRENT CONCENTRATION CHARACTERISTICS

This is a continuation of application Ser. No. 08/286,960, filed Aug. 8, 1994, now abandoned.

BACKGROUND OF THE INVENTION

1. Field of the Invention

This invention relates to a semiconductor device including at least one bipolar transistor, and more particularly to a vertical NPN structure or PNP structure using buried areas of both of N and P conductivity types.

2. Description of the Related Art

Figure 11:
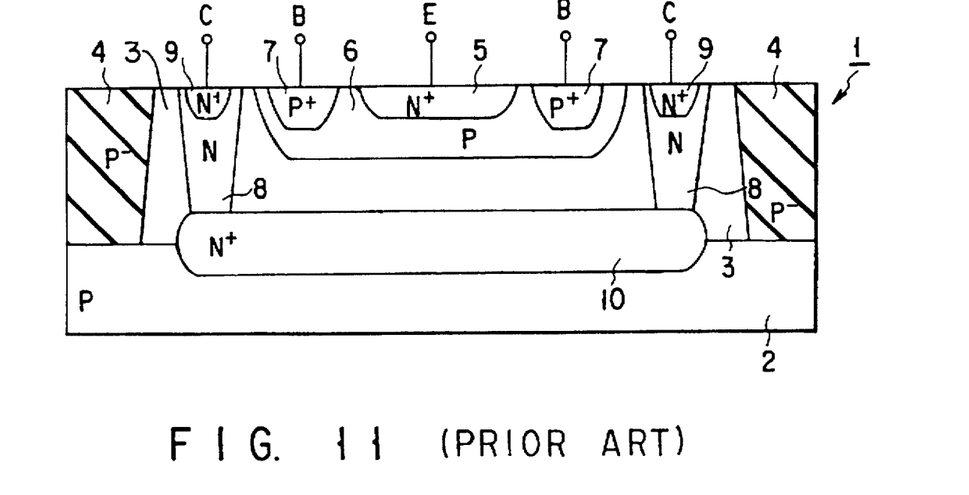
FIG. 11 is a cross sectional view showing a conventional semiconductor device.

A semiconductor device having bipolar transistors has been developed so as to attain high integration density and low power consumption. FIG. 11 is a cross sectional view showing a conventional vertical NPN transistor. A wafer 1 has an N-type epitaxial silicon layer (which is hereinafter referred to as a semiconductor layer) 3 formed on a P-type silicon semiconductor substrate 2. Element isolation regions (P⁻) 4, 4 of low impurity concentration are formed with a preset distance set therebetween in the semiconductor layer 3 and formed in contact with the semiconductor substrate 2. An emitter region (N⁺) 5 of high impurity concentration is formed in the main surface of the semiconductor layer 3 which lies between the element isolation regions 4, 4. An emitter electrode E is connected to the emitter region 5. A P-type base region 6 is formed to surround the emitter region 5. An electrode lead-out region (P⁺) 7 of high impurity concentration is formed in the base region 6 and a base electrode B is connected to the electrode lead-out region 7. An N-type collector region 8 is formed separately from the base region 6 to surround the base region 6. An electrode lead-out region (N⁺) 9 of high impurity concentration is formed in the collector region 8 and a collector electrode C is connected to the electrode lead-out region 9. A buried region (N⁺) 10 is formed in the element forming surface area of the semiconductor substrate 2 which lies between the element isolation regions 4, 4 and the collector region 8 is formed to reach the buried region 10. The transistor is formed in the semiconductor layer 3, but this is not limitative and it is also possible to form an N-type well region in the semiconductor layer 3 and form the transistor in the N well region, for example.

Figure 12:
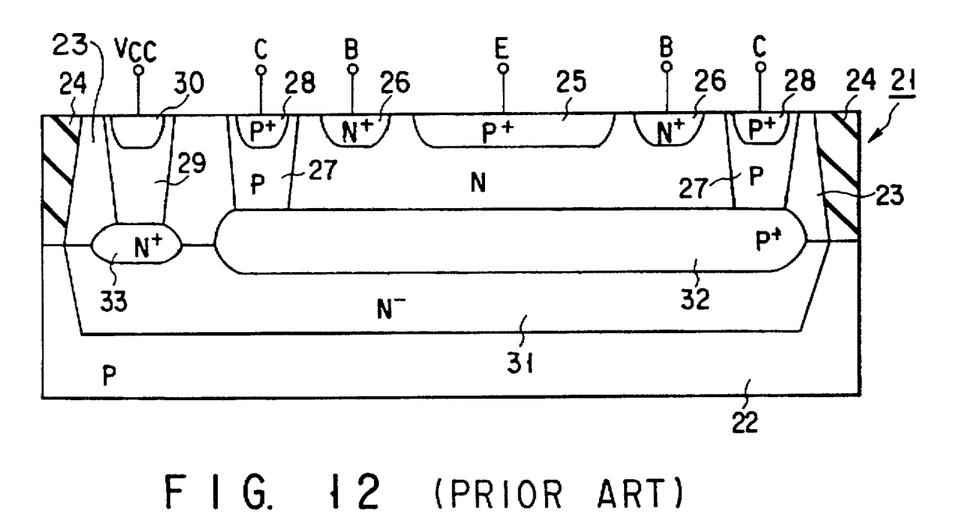
FIG. 12 is a cross sectional view showing a conventional semiconductor device.

FIG. 12 is a cross sectional view showing a conventional vertical PNP transistor. A wafer 21 has an N-type epitaxial silicon layer (which is hereinafter referred to as a semiconductor layer) 23 formed on a P-type silicon semiconductor substrate 22. Element isolation regions (P⁻) 24, 24 of low impurity concentration are formed with a preset distance from each other in the semiconductor layer 23 and formed in contact with the semiconductor substrate 22. An emitter region (P⁺) 25 is formed in the main surface area of the semiconductor layer 23 which lies between the element isolation regions 24, 24. An emitter electrode E is connected to the emitter region 25. A plurality of electrode lead-out regions (N⁺) 26 are formed with a preset distance from the emitter region 25 on both sides of the emitter region 25 and a base electrode B is connected to the electrode lead-out region 26. Further, P-type collector regions 27 are formed in the main surface area of the semiconductor layer 23 to surround the electrode lead-out region 26 and emitter region 25. Electrode lead-out regions (P⁺) 28 are formed in the collector regions 27 and collector electrodes C are connected to the electrode lead-out regions 28. Portion of the semiconductor layer 23 which is surrounded by the emitter region 25 and the collector regions 27 corresponds to a base region. An N-type impurity diffused region 29 is formed in the semiconductor layer 23 in position opposite to the electrode lead-out region 26 with the collector region 27 disposed therebetween. An electrode lead-out region (N⁺) 30 of high impurity concentration is formed in the impurity diffused region 29 and an input electrode Vcc is connected to the electrode lead-out region 30.

An N-type well region 31 is formed in the element forming surface area of the semiconductor substrate 22 which lies between the element isolation regions 24, 24 and a P⁺-type buried region 32 is formed in the well 31. The collector region 27 is formed to reach the buried region 32. Further, an N⁺-type buried region 33 is formed near the P⁺-type buried region 32 in the well 31 and the impurity diffused region 29 is formed to reach the buried region 33.

The relation of the P-type impurity concentrations is P⁻<P<P⁺ and the relation of the N-type impurity concentrations is N⁻<N<N⁺.

In the conventional vertical transistor shown in FIG. 11, the P-type impurity diffused region 6 and impurity diffused region 7 acting as the base region are formed around the impurity diffused region 5 acting as the emitter region and a base potential is applied to the impurity diffused region 7. The base region determines the current amplification factor $h_{fe}$ of common collector configuration and a voltage $V_{ceo}$ between the collector and the emitter with the base-emitter path made open. Likewise, in the vertical PNP transistor shown in FIG. 12, the impurity diffused region 26 acting as the electrode lead-out region is formed around the impurity diffused region 25 acting as the emitter region, and a base potential is applied to the impurity diffused region 26.

In the above conventional vertical transistors, the base potential becomes highest in a portion around the emitter region. Therefore, since a current flows along the shortest path between the impurity diffused regions 5 and 7 in the case of FIG. 11 and along the shortest path between the impurity diffused regions 25 and 26 in the case of FIG. 12, the area of the effective active area between the base and emitter of the vertical NPN or PNP structure is reduced by the current concentration effect that the current flow is concentrated in one portion. The effect significantly appears particularly in a transistor of vertical NPN or PNP structure having an emitter of large area. Further, since the impurity diffused region of high impurity concentration of the base region is present in the base region lying between the emitter region and the collector electrode lead-out region, the substantial distance between the emitter and the collector is increased, thus increasing the collector resistance.

SUMMARY OF THE INVENTION

An object of this invention is to provide a semi-conductor device and a method for manufacturing the same in which the current concentration effect in the vertical NPN or PNP transistor can be reduced and the collector resistance can be reduced.

The above object can be attained by a semiconductor device comprising a first buried region of a first conductivity type formed inside a semiconductor substrate of a second conductivity type; a second buried region of the second conductivity type formed on part of the first buried region inside the semiconductor substrate, the second buried region being formed to project upwardly from the first buried region; a first base region of the second conductivity type formed in the surface area of the semiconductor substrate, the first base region being formed in contact with the second buried region; an emitter region of the first conductivity type formed in the first base region; a second base region of the second conductivity type formed in the surface area of the semiconductor substrate in position separated from the first base region, the second base region being formed in contact with and electrically connected to the second buried region; and a collector region of the first conductivity type formed in the surface area of the semiconductor substrate, the collector region being formed in contact with and electrically connected to the first buried region.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

There will now be described an embodiment of this invention with reference to the accompanying drawings.

First, the first embodiment is explained with reference to FIGS. 1 and 2. In this embodiment, a wafer 41 has an N-type epitaxial silicon layer (which is hereinafter referred to as a semiconductor layer) 43 formed on a P-type silicon semiconductor substrate 42. Element isolation regions (P$^-$) 44, 44 are formed with a preset distance set therebetween in the semiconductor layer 43 and formed in contact with the semiconductor substrate 42. An emitter region (N$^+$) 45 is formed in the main surface area of the semiconductor layer 43 which lies between the element isolation regions 44, 44 and the emitter region 45 is connected to an emitter electrode E. A P-type base region 46 is formed around the emitter region 45.

A P-type base region 47 is formed separately from the base region 46 in the semiconductor layer 43. The base region 47 has a higher impurity concentration than the semiconductor layer 43. An electrode lead-out region (P$^+$) 48 of high impurity concentration is formed in the base region 47 and a base electrode B is connected to the electrode lead-out region 48. The electrode lead-out region 48 is formed by doping an impurity of an amount of approx. $5 \times 10^{15}/cm^2$ into the base region 47. A collector region (N$^+$) 49 is formed separately from the base region 46 in that portion of the semiconductor layer 43 which lies near the other side portion of the base region 46. An electrode lead-out region (N$^+$) 50 is formed in the collector region 49 and a collector electrode C is connected to the electrode lead-out region 50.

The transistor is formed in the semiconductor layer 43, but this is not limitative and it is also possible to form an N-type well region in the semiconductor layer 43 and form the transistor in the well region, for example.

A buried region (N$^+$) 51 is formed in the element forming surface area of the semiconductor substrate 42 10 which lies between the element isolation regions 44, 44. The collector region 49 is formed to reach the buried region 51. Further, a buried region (P$^+$) 52 is formed in the surface area of the buried region 51. One end portion of the buried region 52 is set in contact with the base region 46 and the other end portion thereof is set in contact with the base region 47.

Figure 1:
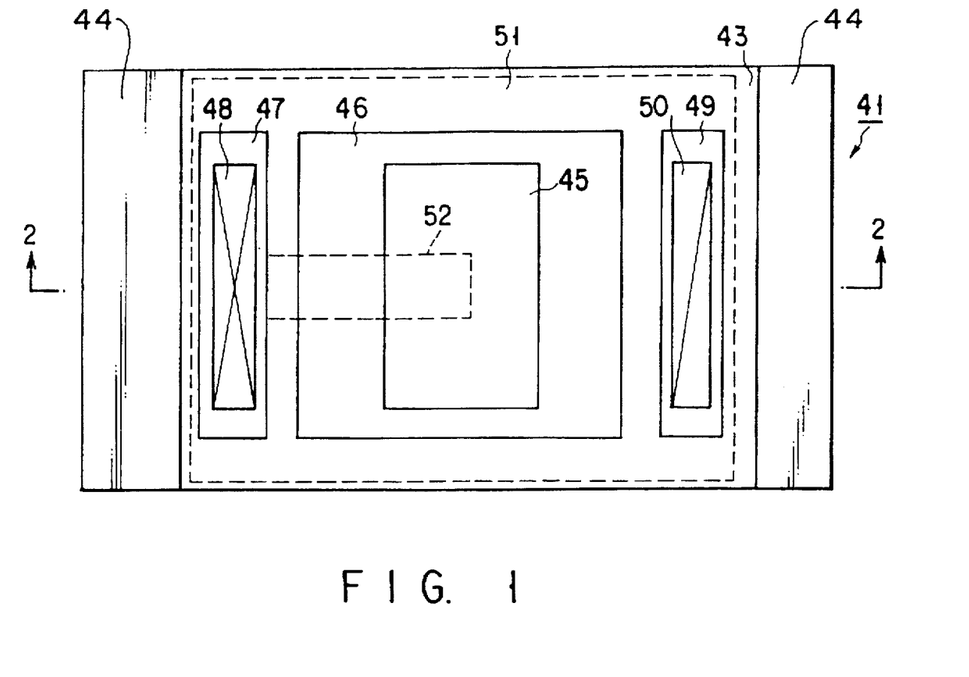
FIG. 1 is a plan view of a semiconductor device according to a first embodiment of this invention.

As shown in FIG. 1, the width of the buried region 52 is determined according to the requirement and may be set to be smaller than the widths of the buried region 51 and base region 47. One end portion of the buried region 52 is set directly below the emitter region 45, but one end portion of the buried region 51 may be set to exceed the base region 46 and lie near the collector region 49 if a base potential can be applied from the base region 47 to the base region 46. Further, the thickness of the buried region 52 is made larger than the thickness of the buried region 51 and extends upwardly and downwardly from the buried region 51 as shown in FIG. 2. An overlapping region of the buried regions 52 and 51 is formed as an N-type region.

Next, a method for manufacturing the above semiconductor device is explained with reference to FIGS. 3A to 5E.

Figure 3A:
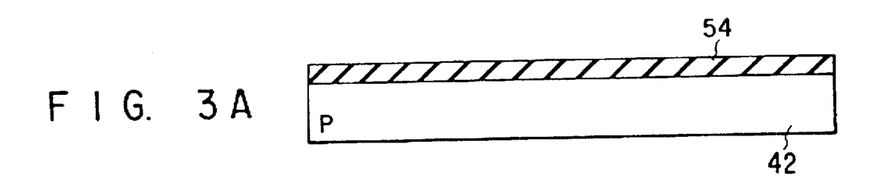
FIGS. 3A to 3F are cross sectional views showing the process of manufacturing the semiconductor device of FIG. 1.
Figure 3B:
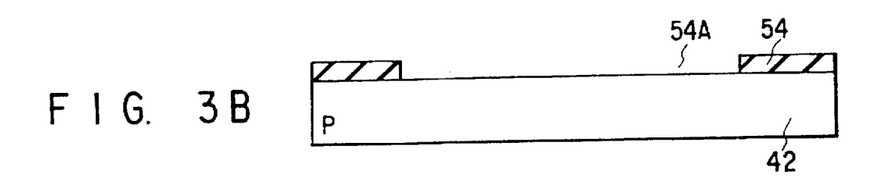
Figure 3C:
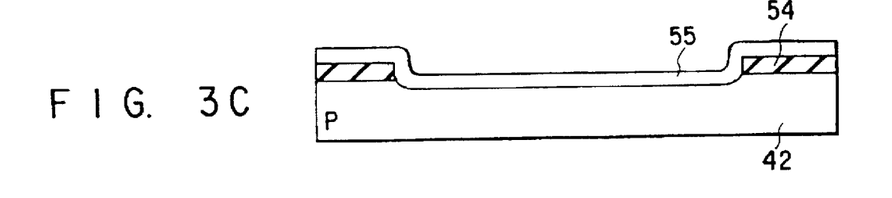

First, as shown in FIG. 3A, a thermal oxide film (SiO$_2$) 54 is formed as a first insulation film by subjecting the surface of the P-type silicon semiconductor substrate 42 having boron (B) doped therein to the heat treatment in a high temperature oxidation atmosphere. Next, a photoresist (not shown) is formed and a resist pattern used for forming buried layers is formed in the photoresist. The insulation film 54 is etched with the resist pattern used as a mask so as to form an opening 54A in the insulation film 54 as shown in FIG. 3B. Then, after the photoresist is removed, the surface of the semiconductor substrate 42 is subjected to the heat treatment in a high temperature oxidation atmosphere again so as to form a second insulation film 55 formed of a thermal oxide film (SiO$_2$) as shown in FIG. 3C.

Figure 3D:
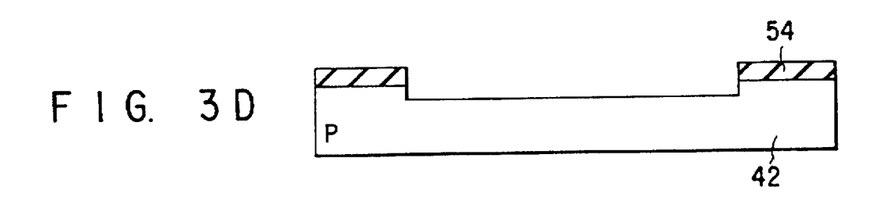
Figure 3E:
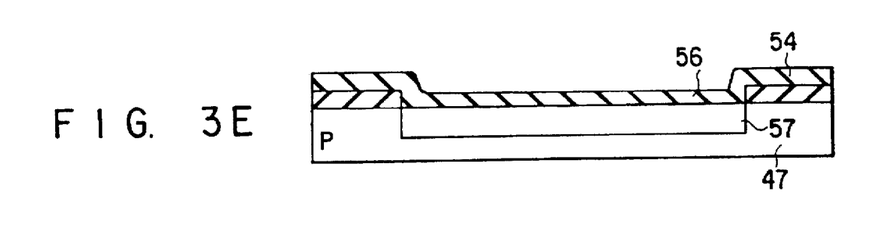
Figure 3F:
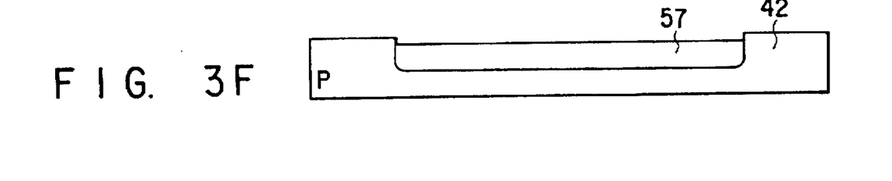

Next, as shown in FIG. 3D, the second insulation film 55 is removed from the surface of the semiconductor substrate 42 and part of the surface area of the semiconductor substrate 42 which lies in the opening 54A is selectively removed. Then, after the pre-processing, a silicate glass film 56 containing antimony (Sb) as impurity, for example, is formed on the entire surface of the semiconductor substrate 42 as shown in FIG. 3E. The silicate glass film 56 is subjected to the heat treatment to diffuse antimony from the opening 54A of the first insulation film 54 into the semiconductor substrate 42 so as to form an N⁺ region 57. At this time, the first insulation film 54 is used as a mask for preventing antimony from being diffused into unwanted portions. After this, the first insulation film 54 and silicate glass film 56 are removed as shown in FIG. 3F.

Figure 4A:
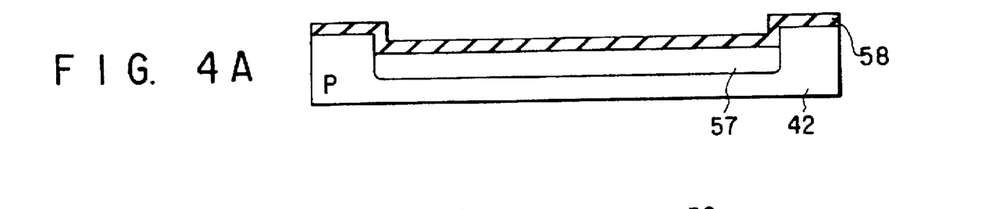
FIGS. 4A to 4F are cross sectional views showing the semiconductor device manufacturing process succeeding the step of FIG. 3F.
Figure 4B:
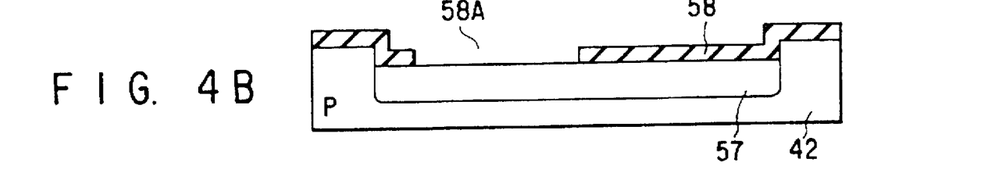
Figure 4C:
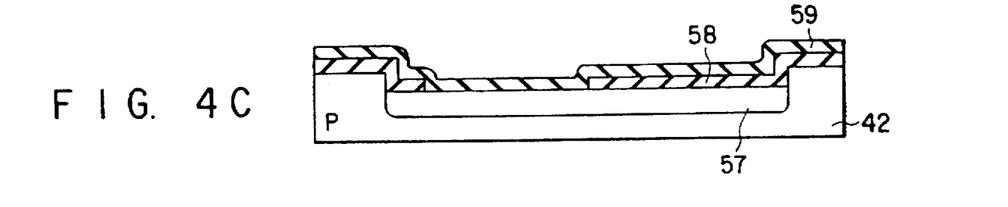
Figure 4D:
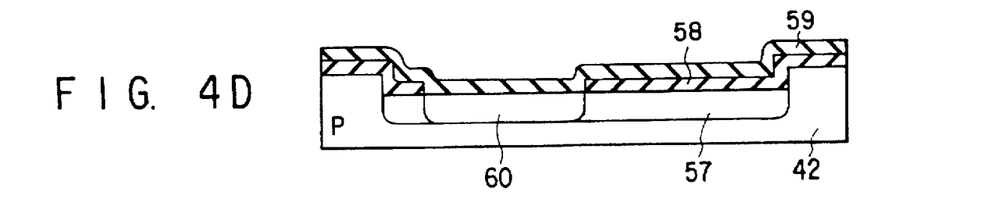

Next, as shown in FIG. 4A, the surface of the semiconductor substrate 42 is subjected to the heat treatment in a high temperature oxidation atmosphere to form a thermal oxide film (SiO₂) as a third insulation film. Then, a photoresist (not shown) is formed and a resist pattern for forming a P⁺ buried region is formed in the photoresist. Part of the insulation film 58 is removed with the resist pattern used as a mask so as to form an opening 58A as shown in FIG. 4B. Then, after the preprocessing, a boron silicate glass film 59 containing boron (B) as impurity, for example, is formed on the entire surface of the semiconductor substrate 42 as shown in FIG. 4C. The boron silicate glass film 59 is subjected to the heat treatment to diffuse boron from the opening 58A of the third insulation film 58 into the semiconductor substrate 42 (N⁺ region 57) so as to form a P⁺ region 60 as shown in FIG. 4D. At this time, the third insulation film 58 is used as a mask for preventing boron from being diffused into unwanted portions.

In this embodiment, the N⁺ region 57 and P⁺ region 60 are formed by use of the solid phase diffusion method, but they may be formed by use of the ion implantation method.

Figure 4E:
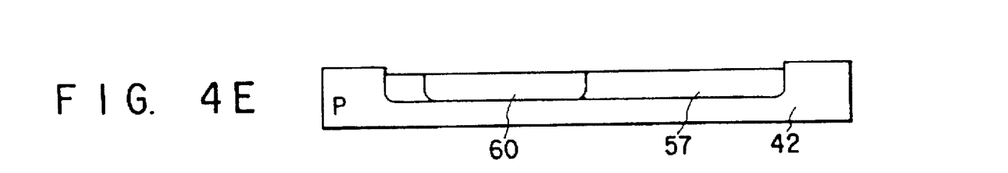

Next, as shown in FIG. 4E, the third insulation film 57 and boron silicate glass film 59 are removed from the surface of the semiconductor substrate 42. Then, the semiconductor substrate 42 is subjected to the heat treatment at approx. 1200° C. for about three hours to grow impurities of the N⁺ region 57 and P⁺ region 60 and change the regions 57 and 60 into the N⁺ buried region 51 and P⁺ buried region 52 shown in FIGS. 1 and 2. The N⁺ region 57 and P⁺ region 60 are formed to partly overlap each other. However, since the diffusion coefficients of antimony for defining the conductivity type of the N⁺ region 57 and boron for defining the conductivity type of the P⁺ region 60 are different from each other and the diffusion coefficient of boron is smaller than that of antimony, the speed of growth of impurity by the heat treatment is higher in the P⁺ region 60. Therefore, the thickness of the P⁺ buried region 52 which is finally formed by growing the impurity of the P⁺ region 60 becomes larger than the thickness of the N⁺ buried region 51 which is finally formed by growing the impurity of the N⁺ buried region 57. As a result, the cross section of the P⁺ buried region 52 projects upwardly and downwardly from the N⁺ buried region 51 as shown in FIG. 4F.

The conductivity type of the overlapped portion of the P⁺ buried region 52 and N⁺ buried region 51 depends on the impurity concentrations of the buried regions 52 and 51. That is, if the impurity concentration of the buried region having a higher impurity concentration becomes substantially ten times higher than that of the buried region having a lower impurity concentration, the conductivity type of the overlapped portion can be defined as the conductivity type of the buried region having the higher impurity concentration. In this embodiment, the impurity concentration of the N⁺ buried region 51 is approx. $7 \times 10^{18}/cm^3$ and the impurity concentration of the P⁺ buried region 52 is approx. $6 \times 10^{17}/cm^3$. Therefore, the overlapped portion of the two buried regions 51 and 52 is formed as an N-type impurity region. The volume ratio of the buried regions 51 and 52 depends on the processing time when the processing temperature is kept constant.

Figure 4F:
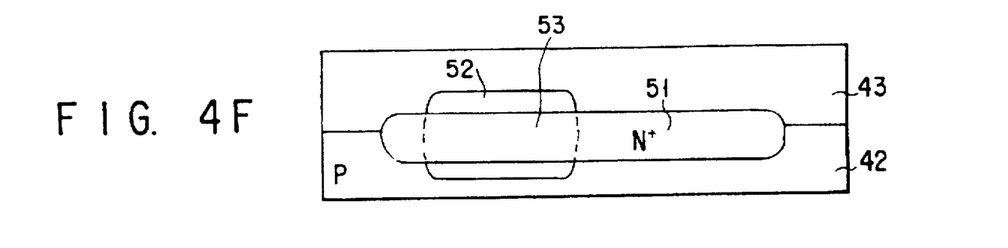
Figure 5A:
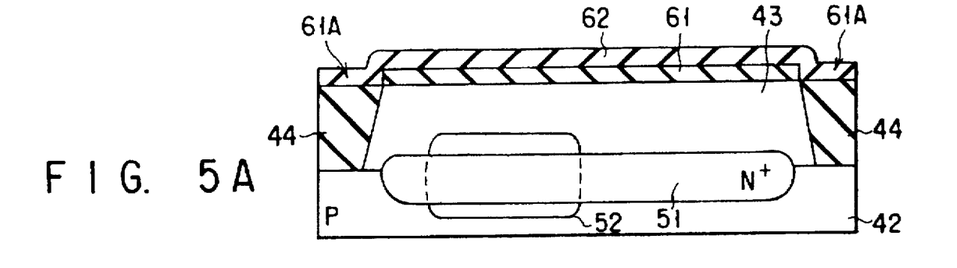
FIGS. 5A to 5E are cross sectional views showing the semiconductor device manufacturing process succeeding the step of FIG. 4F.

As described above, the semiconductor layer 43 is formed on the semiconductor substrate 42 as shown in FIG. 4F by the epitaxial growth for, for example, decomposing and reacting the silane composite and the phosphorus composite at high temperatures after the buried regions 51, 52 are formed on the semiconductor substrate 42. Next, as shown in FIG. 5A, an insulation film (SiO₂) 61 formed of thermal oxide film is formed on the semiconductor layer 43 and openings 60A, 60A for forming element isolation regions 44, 44 are formed in the insulation film 61. A boron silicate glass film 62 is formed on the entire surface of the insulation film 61 having the openings 60A, 60A by the low temperature vapor deposition. After this, the semiconductor substrate 42 and semiconductor layer 43 are subjected to the heat treatment at approx. 1200° C. so as to thermally diffuse boron of the glass film 62 into the semiconductor layer 43 and form a P-type impurity diffused region which reaches the semiconductor substrate 42 as the element isolation region 44.

Figure 5B:
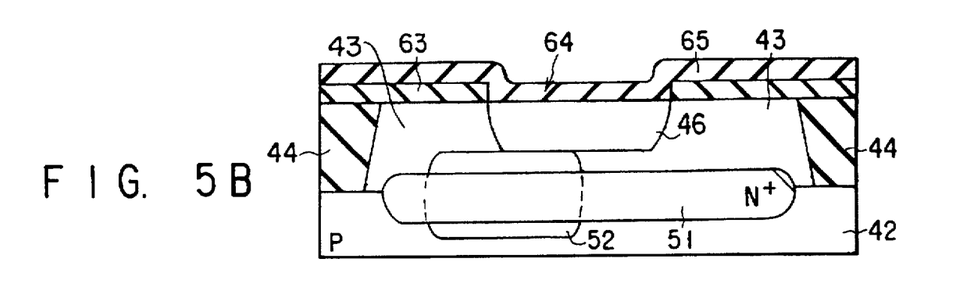

Next, the insulation film 61 and boron silicate glass film 62 are removed from the semiconductor layer 43. After this, as shown in FIG. 5B, an insulation film 63 used as a mask having an opening 64 and a boron silicate glass film 65 are sequentially formed. The method for forming the insulation film 63 and boron silicate glass film 65 is the same as that of FIG. 5A. After this, the semiconductor substrate 42 and semiconductor layer 43 are subjected to the heat treatment so as to thermally diffuse boron of the boron silicate glass film 65 into the semiconductor layer 43 and form a base region 46 which reaches the buried region 52 in the semiconductor layer 43.

Figure 5C:
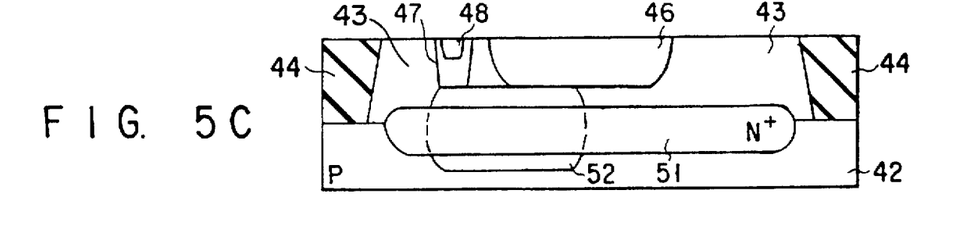
Figure 5D:
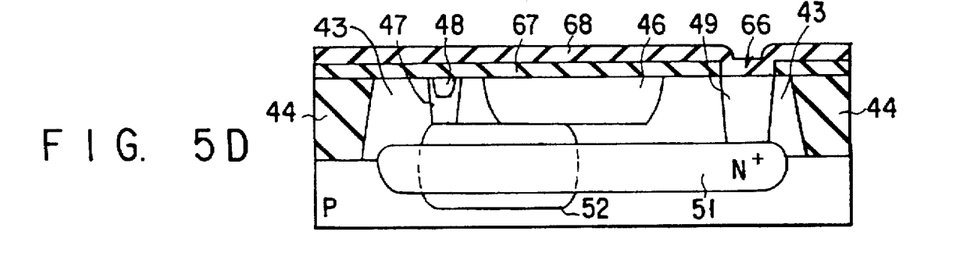

Next, the insulation film 63 and boron silicate glass film 65 are removed from the semiconductor layer 43. Then, as shown in FIG. 5C, a P-type base region 47 set in contact with the buried region 52 is formed in that portion of the semiconductor layer 43 which lies between the element isolation region 44 and the base region 46 by the same method as described above and a P⁺ electrode lead-out region 48 is formed in the base region 47.

Next, as described before, as shown in FIG. 5D, an insulation film 67 having an opening 66 formed therein and used as a mask and a silicate glass film 68 having phosphorus (P) and arsenic (As) doped therein are formed on the surface of the semiconductor layer 43. After this, phosphorus and arsenic in the silicate glass film 68 are thermally diffused into the semiconductor layer 43 at approx. 1100° C. to form an N⁺-type collector region 49 in contact with the N⁺ buried region 51. Further, an electrode lead-out region 50 is formed in the collector region 49 and an N⁺ emitter region 45 is formed in the base region 46.

Figure 5E:
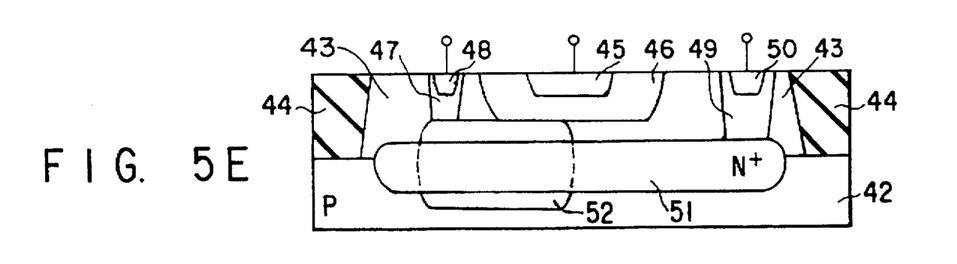

Next, an inter-level insulation film (not shown) is formed on the semiconductor layer 43, and metal wirings (not shown) of aluminum, for example, are formed on the inter-level insulation film to form an emitter electrode E, base electrode B and collector electrode C which are respectively connected to the emitter region 45, electrode lead-out regions 48 and 50 by use of the metal wirings. Finally, an insulation film (not shown) is formed as a protection film by use of silicate glass on the entire surface of the structure so as to cover the above metal wirings and the like.

Next, a second embodiment of this invention is explained with reference to FIGS. 6 and 7. In a wafer 71, an N-type epitaxial silicon semiconductor layer (which is hereinafter referred to as a semiconductor layer) 73 is formed on a P-type silicon substrate 72. P⁻-type element isolation regions 74, 74 are formed with a preset distance set therebetween in the semiconductor layer 73. The element isolation regions 74, 74 are formed in contact with the semiconductor substrate 72. A P$^+$ emitter region 75 is formed in the main surface area of the wafer 71 which lies between the element isolation regions 74, 74 and an emitter electrode E is connected to the emitter region 75. First and second collector regions (P$^+$) 76, 77 are formed on both sides of the emitter region 75 in the semiconductor layer 73. A semiconductor layer 73A which lies between the first and second collector regions 76 and 77 constitutes a first base region. P$^+$ electrode lead-out regions 78, 79 are respectively formed in the first and second collector regions 76, 77 and collector electrodes C are connected to the electrode lead-out regions 78, 79. In the semiconductor layer 73, a second base region 80 of N-type is formed in position opposite to the emitter region 75 with the collector region 77 disposed therebetween. An N$^+$ electrode lead-out region 81 is formed in the second base region 80 and a base electrode B is connected to the electrode lead-out region 81.

The transistor is formed in the semiconductor layer 73 which is formed on the silicon substrate 72, but this is not limitative and it is also possible to form an N-well region in the semiconductor substrate 72 and form the transistor in the N-well region, for example.

An N-well 82 is formed in the element forming area of the semiconductor substrate 72 and a P$^+$ buried region 83 is formed in the N-well 82. The buried region 83 is formed in substantially the entire area between the element isolation regions 74, 74. The collector regions 76, 77 are formed to reach the buried region 83. An opening 83A is formed in that portion of the buried region 83 which lies directly below the emitter region 75. An N$^+$ buried region 84 is formed to overlap the buried region 83 in the N-well 82. One end portion of the buried region 84 lies in the opening 83A and is made in contact with the first base region 73A and the other end portion thereof lies outside the buried region 83 and is made in contact with the second base region 80. Therefore, a base potential applied from the second base region 80 to the other end portion of the buried region 84 is applied to the first base region 73A via the one end portion of the buried region 84 which lies in the opening 83A.

Figure 6:
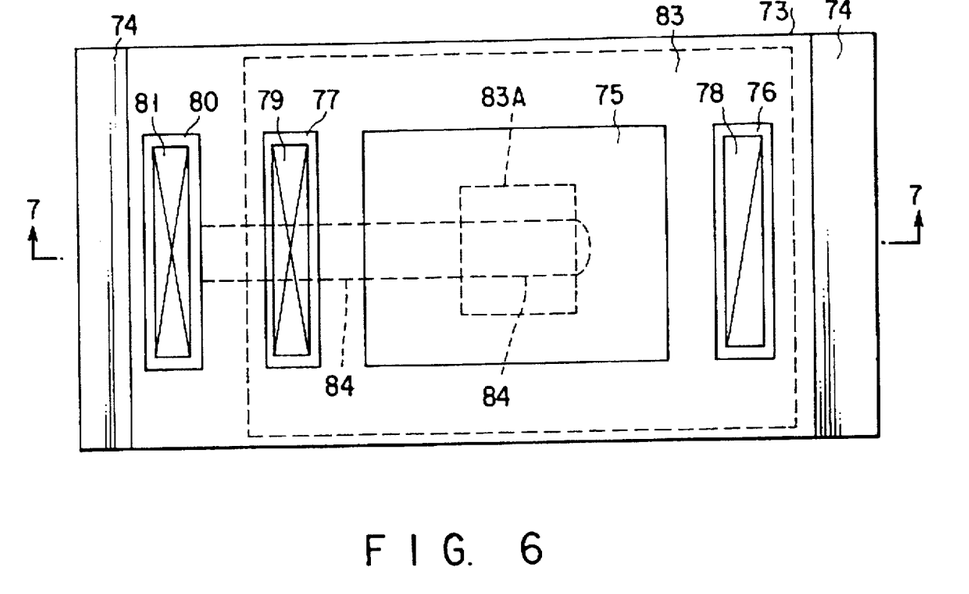
FIG. 6 is a plan view of a semiconductor device according to a second embodiment of this invention.
Figure 7:
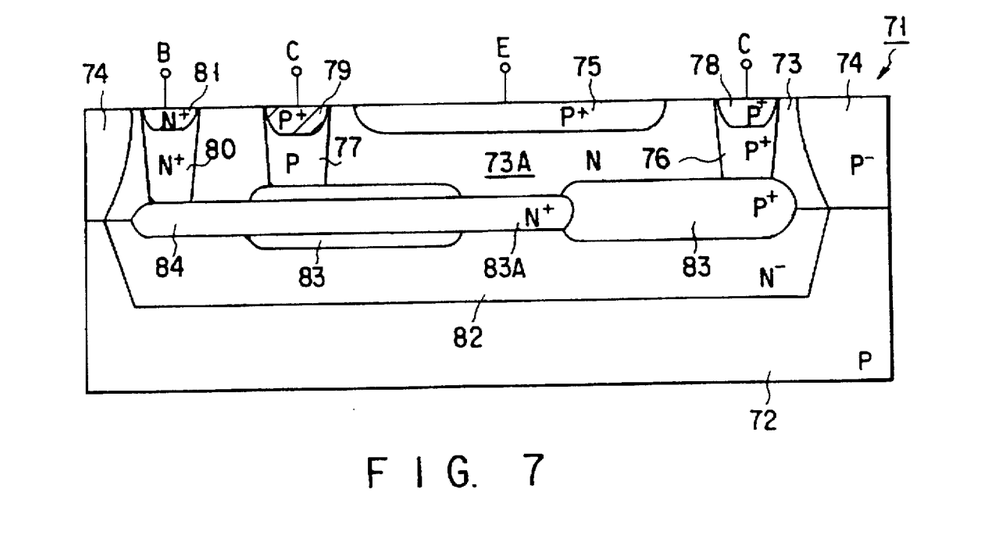
FIG. 7 is a cross sectional view taken along the 7—7 line of FIG. 6.

As shown in FIG. 6, the width of the buried region 84 is made smaller than that of the buried region 83 and that of the second base region 80. The buried region 84 may be formed to partly lie below the emitter region 75 so as to permit the base potential to be applied to the first base region 73A. Therefore, the front end portion of the buried region 84 may be set near the collector region 76 and the width of the buried region 84 can be made larger if necessary.

The buried region 83 is made thick in the upward and downward directions of the buried region 84. In order to form the above buried region 83, a plurality of impurities of different conductivity types are doped into the semiconductor substrate by the ion-implantation or solid phase diffusion, and then, the impurities are thermally diffused to simultaneously form two types of buried regions of different conductivity types.

That is, the method for manufacturing the semiconductor device of this embodiment is substantially the same as that of the first embodiment. A first high impurity concentration region is formed in an area in which the buried region 83 is to be formed and an opening 83A is formed in the first high impurity concentration region. After this, a second high impurity concentration region is formed in position corresponding to the buried region 84. Next, the high impurity concentration regions are subjected to the heat treatment to simultaneously form two types of buried regions of different conductivity types. Since the first and second high impurity concentration regions use impurities having different diffusion coefficients, the two buried regions can be easily formed even if they overlap each other. The conductivity type of the overlapped portion of the two regions depends on the conductivity type of one of the two regions overlapping each other which has a higher impurity concentration. The thickness of the buried region can be easily determined by the diffusion time.

Figure 8:
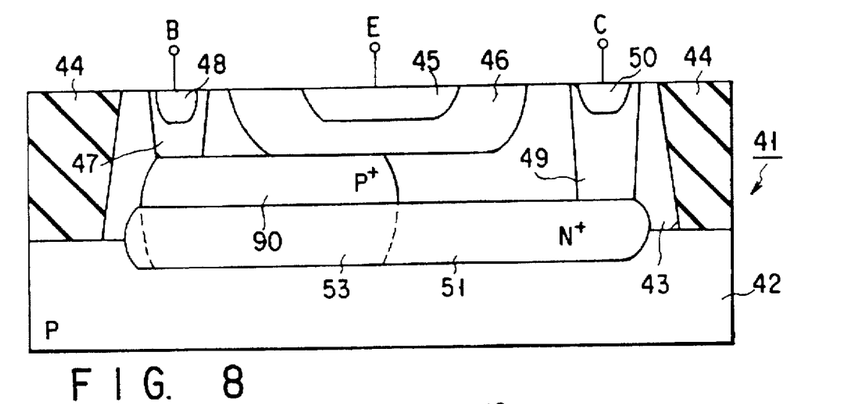
FIG. 8 is a cross sectional view of a semiconductor device according to a third embodiment of this invention.

Next, a third embodiment of this invention is explained with reference to FIG. 8. This embodiment is obtained by modifying the first embodiment, portions which are the same as those of FIGS. 1 and 2 are denoted by the same reference numerals and only the different portions are explained.

In this embodiment, a buried region 90 formed in the surface area of a semiconductor substrate 42 is different from that of the first embodiment. In the first embodiment, the buried region 52 is formed to project upwardly and downwardly from the buried region 53, but in this embodiment, the buried region 90 is formed to project only upwardly from the buried region 53 and is not formed below the buried region 53. The conductivity type of an overlapped portion of the buried regions 53 and 90 is N-type since the impurity concentrations of the two buried regions are set in the same manner as in the first embodiment. Therefore, like the first embodiment, the conductivity type of that portion of the buried region 90 which lies above the buried region 51 is different from the conductivity type of that portion thereof which overlaps the buried region 51.

Figure 2:
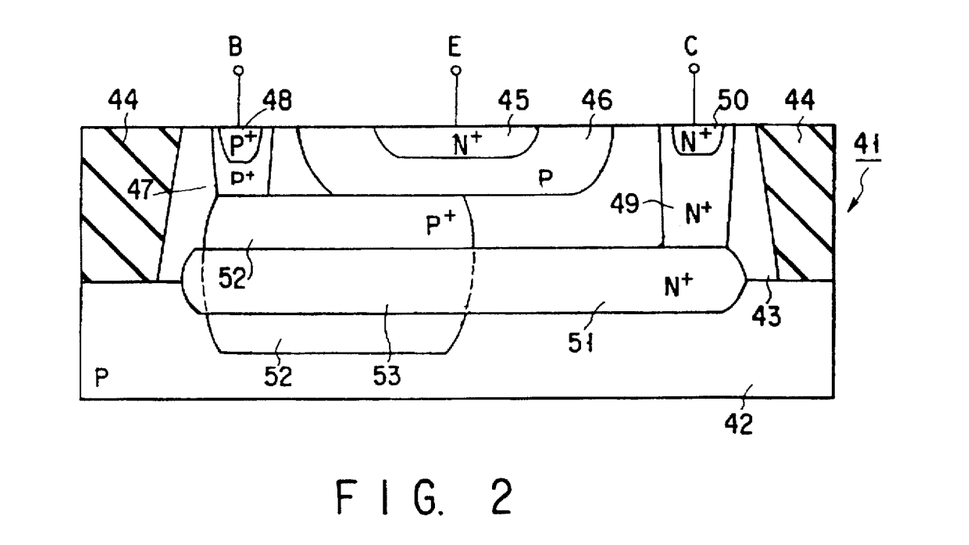
FIG. 2 is a cross sectional view taken along the 2—2 line of FIG. 1.

In FIG. 2, a portion of the buried region 52 which lies above the buried region 51 is connected to the base regions 47 and 46 and acts as a base region together with them. However, a portion of the buried region 52 which lies below the buried region 51 does not act as a constituent of the transistor. Therefore, in this embodiment, the buried region 90 is not formed below the the buried region 51 so as to reduce the base resistance.

In order to remove a portion of the buried region 90 which lies below the buried region 51, the P$^+$ region 60 is formed to be shallower than the N$^+$ region 57 when the N$^+$ region 57 and P$^+$ region 60 explained with reference to FIGS. 4D, 4E are formed. After this, when the regions are subjected to the heat treatment, the buried regions 51, 90 shown in FIG. 8 can be formed by stopping the heat treatment before the P$^+$ region 60 becomes deeper than the N$^+$ region 57. The method and structure for forming the P$^+$ buried region so as not to lie below the N$^+$ buried region can also be applied to the second embodiment.

Figure 9:
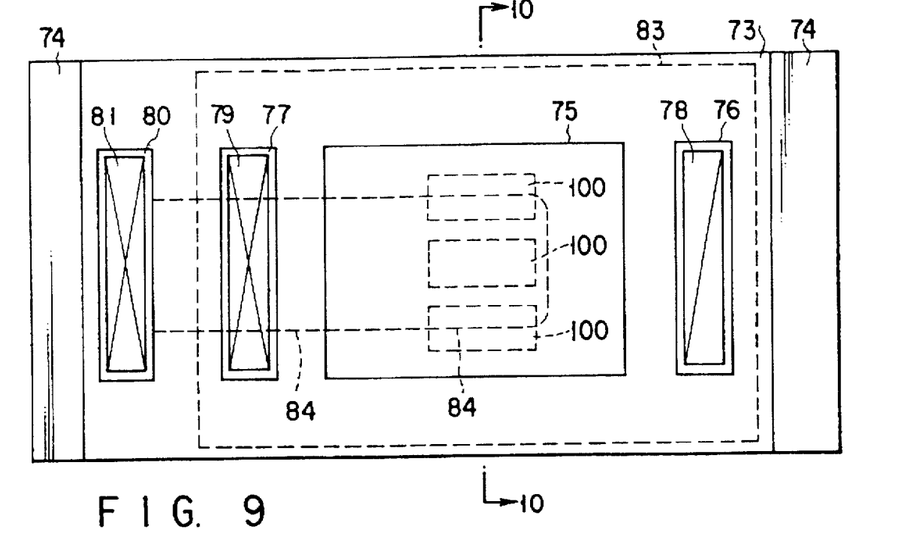
FIG. 9 is a plan view of a semiconductor device according to a fourth embodiment of this invention.
Figure 10:
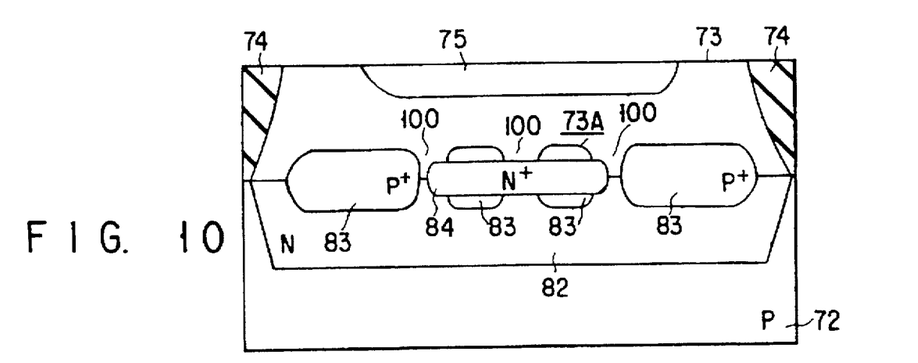
FIG. 10 is a cross sectional view taken along the 10—10 line of FIG. 9.

Next, a fourth embodiment of this invention is explained with reference to FIGS. 9 and 10. This embodiment is a modification of the second embodiment, and portions which are the same as those of FIGS. 6, 7 are denoted by the same reference numerals and only the different portion is explained.

In this embodiment, an N-type buried region 84 is formed to overlap a P-type buried region 83 in an N-well and the base region 80 is connected to the buried region. The P-type buried region 83 connected to the collector regions 76, 77 is formed on substantially the entire portion of the semiconductor layer 73 surrounded by the element isolation region 74 and a plurality of openings 100 are formed below the emitter region 75. The other end portion of the N-type buried region 84 is set to lie in the openings 100 and a base potential is applied to the base region 73A via the N-type buried region 84. As shown in FIG. 9, the width of the buried region 84 is smaller than that of the P-type buried region 83. A method for manufacturing the semiconductor device shown in this embodiment is the same as that of the second embodiment, and therefore, explanation for the manufacturing method is omitted.

The current concentration between the base and emitter can be further reduced and the effective active area between the base and emitter can be increased by forming a plurality of openings 100 in the buried region 83 as in this embodiment.

According to the first to fourth embodiments, the base region is formed around the emitter region and a base potential is applied to the base region from under the emitter region. Therefore, the current concentration effect can be reduced and the effective active area can be increased. Further, since the distance between the emitter region and the electrode lead-out region can be reduced, the internal resistance of the collector can be reduced.

Further, two types of buried regions having different conductivity types can be simultaneously formed by thermally diffusing impurities with different diffusion coefficients. Therefore, the dimension of the buried region can be freely adjusted by adjusting the diffusion time.

The semiconductor device and manufacturing method of this invention can be applied to Bi-CMOS elements, and particularly, they are suitable for driver ICs for controlling motors.

What is claimed is:

1. A semiconductor device comprising:
    a first buried region of a first conductivity type formed inside a semiconductor substrate of a second conductivity type;
    a second buried region of the second conductivity type formed on part of said first buried region inside said semiconductor substrate, said second buried region being formed above said first buried region;
    a first base region of the second conductivity type formed in a surface area of said semiconductor substrate, said first base region being formed in contact with said second buried region;
    an emitter region of the first conductivity type formed in said first base region;
    a second base region of the second conductivity type formed in the surface area of said semiconductor substrate in a position separated from said first base region, said second base region being formed in contact with and electrically connected to said second buried region; and
    a collector region of the first conductivity type formed in the surface area of said semiconductor substrate, said collector region being formed in contact with and electrically connected to said first buried region;
    wherein said second buried region is in contact with a lower surface of said first base region, and a distance between said second buried region and said collector region is greater than a distance between said first base region and said collector region.

2. A device according to claim 1, wherein said semiconductor substrate includes an epitaxial silicon layer.

3. A device according to claim 1, wherein said first conductivity type is an N-type and said second conductivity type is a P-type.

4. A device according to claim 1, wherein a width of said second buried region is smaller than the width of said first buried region.

5. A semiconductor device comprising:
    a semiconductor substrate of a first conductivity type, said semiconductor substrate acting as a first base region;
    a first buried region of a second conductivity type formed inside said semiconductor substrate, said first buried region having a plurality of openings formed therein;
    a second burried region of the first conductivity type having a central portion positioned in said first burried region, one longitudinal end portion positioned outside said first burried region, and another longitudinal end portion positioned in said plurality of openings, said first burried region being formed to project substantially perpendicular to a longitudinal direction of extension of said second burried region between said longitudinal end portions thereof, toward a surface of the semiconductor substrate from said second burried region;
    an emitter region of the second conductivity type formed in a surface area of said semiconductor substrate above said opening;
    a second base region of the first conductivity type formed in the surface area of said semiconductor substrate, said second base region being formed in contact with and electrically connected to the one longitudinal end portion of said second burried region; and
    a collector region of the second conductivity type formed between said second base region and said emitter region in the surface area of said semiconductor substrate, said collector region being formed in contact with and electrically connected to said first burried region.

6. A device according to claim 5, wherein said semiconductor substrate includes an epitaxial silicon layer.

7. A device according to claim 5, wherein said first conductivity type is an N-type and said second conductivity type is a P-type.

8. A device according to claim 5, wherein a width of said second buried region is smaller than the width of said first buried region.

9. A device according to claim 5, wherein said collector region is formed on both sides of said emitter region.

10. A semiconductor device comprising:
    a semiconductor substrate of a first conductivity type;
    a first buried region of a second conductivity type formed inside said semiconductor substrate, said first buried region having an opening;
    a second buried region of the first conductivity type having a central portion positioned in said first buried region, one end portion positioned outside said first buried region and the other end portion positioned in said opening, said first buried region being formed to project towards a surface of the semiconductor from said second buried region;
    a first base region of first conductivity type formed in said semiconductor substrate, said first base region being in contact with an upper surface of the first buried region and an upper surface of the other end portion of the second buried region;
    an emitter region of the second conductivity type formed in a surface area of said first base region above said opening;
    a second base region of the first conductivity type formed in the surface area of said semiconductor substrate, said second base region being formed in contact with and electrically connected to the one end portion of said second buried region; and a collector region of the second conductivity type formed between said second base region and emitter region in the surface area of said semiconductor substrate, said collector region being formed in contact with and electrically connected to said first buried region.

11. A semiconductor device comprising:

a semiconductor substrate of a first conductivity type, said semiconductor substrate acting as a first base region;

a first buried region of a second conductivity type formed inside said semiconductor substrate, said first buried region having an opening;

a second buried region of the first conductivity type having a central portion positioned in said first burried region, one longitudinal end portion positioned outside said first burried region, and another longitudinal end portion positioned in said opening and in contact with the semiconductor substrate, said first buried region being formed to project substantially perpendicular to a longitudinal direction of extension of said second burried region between said longitudinal end portions thereof, toward a surface of the semiconductor substrate from said second burried region;

an emitter region of the second conductivity type formed in a surface area of said semiconductor substrate above said opening;

a second base region of the first conductivity type formed in the surface area of said semiconductor substrate, said second base region being formed in contact with and electrically connected to the one end portion of said second burried region; and a collector region of the second conductivity type formed between said second base region and said emitter region in the surface area of said semiconductor substrate, said collector region being formed in contact with and electrically connected to said first buried region.

* * * * *

UNITED STATES PATENT AND TRADEMARK OFFICE
CERTIFICATE OF CORRECTION

PATENT NO. : 5,719,432
DATED : February 17, 1998
INVENTOR(S) : Heroshi Kariyazono et al.

It is certified that error appears in the above-identified patent and that said Letters Patent is hereby corrected as shown below:

Claim 5, Col. 10, line 8, change "burried" to --buried--.

Claim 5, Col. 10, line 14, change "burried" to --buried--.

Claim 5, Col. 10, line 16, change "burried" to --buried--.

Claim 5, Col. 10, line 25, change "burried" to --buried--.

Claim 5, Col. 10, line 30, change "burried" to --buried--.

Claim 14, Col. 11, line 13, change "burried" to --buried--.

UNITED STATES PATENT AND TRADEMARK OFFICE
CERTIFICATE OF CORRECTION

PATENT NO. : 5,719,432
DATED : February 17, 1998
INVENTOR(S) : Hiroshi Kariyazono et al.

It is certified that error appears in the above-identified patent and that said Letters Patent is hereby corrected as shown below:

Claim 14, Col. 11, line 15, change "burried" to --buried--.

Claim 14, Col. 11, penultimate line, change "burr" to --bur--.

Claim 14, Col. 12, line 3, change "burried" to --buried--.

Claim 14, Col. 12, line 11, change "burried" to --buried--.

Signed and Sealed this

Twenty-second Day of June, 1999

Attest:

Q. TODD DICKINSON

*Attesting Officer*     *Acting Commissioner of Patents and Trademarks*